(12) United States Patent
Morton et al.

(10) Patent No.: US 6,548,874 B1
(45) Date of Patent: Apr. 15, 2003

(54) HIGHER VOLTAGE TRANSISTORS FOR SUB MICRON CMOS PROCESSES

(75) Inventors: Alec Morton, Plano, TX (US); Taylor Efland, Richardson, TX (US); Chin-yu Tsai, Plano, TX (US); Jozef C. Mitros, Richardson, TX (US); Dan M. Mosher, Plano, TX (US); Sam Shichijo, Plano, TX (US); Keith Kunz, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/669,391

(22) Filed: Sep. 26, 2000

Related U.S. Application Data (60) Provisional application No. 60/161,777, filed on Oct. 27, 1999.

(51) Int. Cl.$^7$ .................. H01L 29/76; H01L 29/94; H01L 31/062; H01L 31/113; H01L 31/119
(52) U.S. Cl. .............. 257/371; 257/344; 257/408; 257/502
(58) Field of Search ................ 257/344, 346, 257/387, 408, 345, 371, 487, 34, 370, 502

(56) References Cited

U.S. PATENT DOCUMENTS

| | | | | |
|---|---|---|---|---|
| 5,026,657 A | * | 6/1991 | Lee et al. | 438/210 |
| 5,293,055 A | * | 3/1994 | Hara et al. | 257/371 |
| 5,612,643 A | * | 3/1997 | Hirayama | 257/534 |
| 5,780,907 A | * | 7/1998 | Ema et al. | 257/371 |
| 6,172,401 B1 | * | 1/2001 | Brand | 257/344 |
| 6,180,983 B1 | * | 1/2001 | Merrill | 257/347 |
| 6,262,447 B1 | * | 7/2001 | Chi | 257/408 |
| 6,265,752 B1 | * | 7/2001 | Liu et al. | 257/487 |

* cited by examiner

Primary Examiner—David Nelms
Assistant Examiner—Andy Huynh
(74) Attorney, Agent, or Firm—Peter K. McLarty; W. James Brady, III; Frederick J. Telecky, Jr.

(57) ABSTRACT

An intergrated circuit drain extension transistor for sub micron CMOS processes. A transistor gate (40) is formed over a CMOS n-well region (80) and a CMOS p-well region (70) in a silicon substrate (10). Transistor source regions (50), (140) and drain regions (55), (145) are formed in the various CMOS well regions to form drain extension transistors where the CMOS well regions (70), (80) serve as the drain extension regions of the transistor.

32 Claims, 8 Drawing Sheets

HIGHER VOLTAGE TRANSISTORS FOR SUB MICRON CMOS PROCESSES

This application claims priority of provisional application Ser. No. 60/161,777 filed Oct. 27, 1999.

FIELD OF THE INVENTION

The invention is generally related to the field of MOSFET transistors and more specifically to an integrated high voltage drain extended transistor for CMOS applications.

BACKGROUND OF THE INVENTION

In integrated circuits there is often the need to have a number of different operating voltages. Circuits that use transistors with gate lengths less than 0.25 um typically operate at voltages less than 2.5 volts. For input-output operations (i.e., connection to circuits external to the chip) longer gate length transistors (>0.3 um) typically operate at about 2.5V to 3.3V. In some instances such as disk drive controllers, the circuits might require a 5 volt Signal. In these cases, transistors capable of operating at high voltages are required. A transistor suitable for use at high voltages in integrated circuits is a drain extended (DE) transistor. Drain extended transistors may also be used in applications where the voltage on the drain exceeds the normal voltage rating of the gate oxide. Drain extended transistors differ from regular self aligned poly-silicon gate transistors in that they use a very lightly doped extension region adjacent to the drain that depletes at high drain voltages. This allows much of voltage to be dropped across the silicon, reducing the electric field across the gate oxide to a safe level. Drain extended transistors allow operation at several times the rated voltage of core transistors, can handle analog signals of several volts, are suitable for power amplifiers and power conditioning circuits, and are generally more robust than conventional transistors having the same thickness of gate oxide. In particular, it is not necessary to add extra drain implants to control channel hot carrier (CHC) effects, and the higher breakdown voltage simplifies electrostatic discharge (ESD) protection; for example it is not normally necessary to include the resistors commonly required in series with application specific integrated circuits (ASIC) outputs.

Typically, to incorporate DE transistors into a CMOS integrated circuit, additional and special processes are required. These processes usually add cost and complexity to producing the integrated circuit. In the instant invention, DE transistor structures and processing methods are described that allow the incorporation of high voltage DE transistors into integrated circuits where the core CMOS transistor has a gate length of <0.30 um without introducing added processing complexity.

SUMMARY OF THE INVENTION

The integrated DE transistor structures described herein according to the instant invention can be fabricated using technology suitable for fabricating transistors with sub micron gate lengths.

An embodiment of the instant invention is an integrated circuit drain extended transistor comprising: a semiconductor substrate containing a, first well region adjacent to a second well region; a transistor gate overlying said first well region and said second well region; a transistor source region of a first conductivity type adjacent to said transistor gate and contained in said first well region; and a transistor drain region of a first conductivity type contained in said second well region.

Another embodiment of the instant invention is an integrated circuit drain extended transistor comprising: a semiconductor substrate containing a first well region; a transistor gate partially overlying said first well region and said semiconductor substrate; a transistor source region of a first conductivity type adjacent to said transistor gate and contained in said semiconductor substrate; and a transistor drain region of a first conductivity-type contained in said first well region.

BRIEF DESCRIPTION OF THE DRAWINGS

In the drawings:

FIG. 2A–FIG. 13 are cross-section diagrams illustrating various embodiments of the instant invention.

Common reference numerals are used throughout the figures to represent like or similar features. The figures are not drawn to scale and are merely provided for illustrative purposes.

DETAILED DESCRIPTION OF THE DRAWINGS

The following description of the instant invention revolves around FIGS. 1–13. The methodology of the instant invention provides a solution: to integrating high voltage DE transistors and core CMOS transistors in the same integrated circuit chip using CMOS processes suitable for fabricating sub micron gate length transistors.

Figure 1:
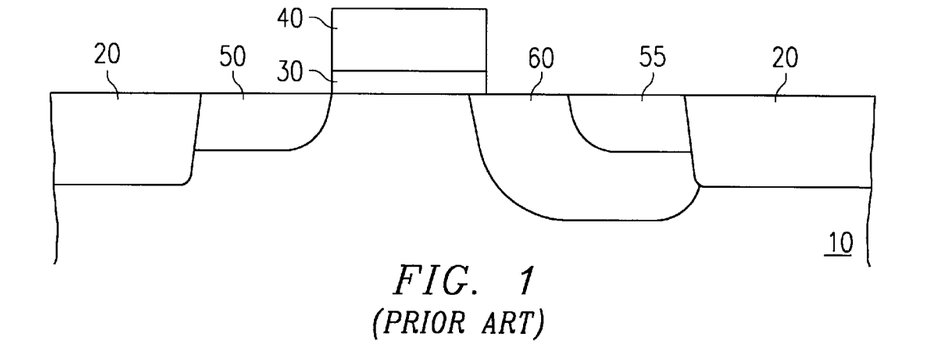
FIG. 1 is a cross-sectional diagrams of a typical drain extended transistor

The following description of the instant invention will be related to FIGS. 1–13. A typical cross-section of a DE transistor is shown in FIG. 1. A p-type substrate 10 is provided and shallow trench isolation (STI) structures 20 are formed in the substrate 10. The STI structures are formed using known semiconductor processing techniques and can be silicon oxide, silicon nitride, or any insulating material with suitable properties. A gate dielectric 30 is formed on the substrate 10. The gate dielectric 20 may be comprised of an oxide, thermally grown SiO2, a nitride, an oxynitride, or any combination thereof. A layer of conductive material (which will be patterned and etched to form gate structure 40) is formed on gate dielectric 30. Preferably, this conductive material is comprised of polycrystalline silicon ("poly" or "polysilicon"), but it may be comprised of epitaxial silicon or any other semiconducting material. The DE transistor contains a source 50 and a drain region 55 and a lightly doped drain extension 60. For the case of a p-type substrate 10, the source region 50 and the drain region 55 will be doped n-type. The very lightly doped drain extension 60 will also be doped n-type but will have a dopant concentration much less than that of the source region 50 and the drain region 55. The doping concentration of the very lightly doped drain extension is chosen such that it will deplete when the drain to gate voltage increases.

A twin well process is used to fabricated most sub micron CMOS circuits. In this process, a n-type well region is formed in the substrate in which a PMOS transistor will be formed. A p-type well region is also formed in the substrate in which a NMOS transistor is fabricated. The n-type well and p-type well regions are formed by implanting n-type and p-type dopant species into the substrate respectively. In addition to the well implants, a number of additional implants are required to fabricate sub micron CMOS integrated circuits. These include n-type and p-type punch through implants for reducing transistor off current, n-type and p-type channel stop implants for reducing isolation leakage, n-type and p-type threshold adjust implants for setting the NMOS and PMOS transistor threshold voltages, and n-type and p-type pocket implants for reducing threshold voltage roll-off. In both types of wells, the threshold adjust implant is the shallowest. The punch through implant is the next deepest, and provides, a higher concentration at a greater depth to increase the source to drain punch through breakdown voltage, with only a small concentration near the surface and with only a small effect on the threshold voltage. The third implant is channel stop, is deeper still and provides a sufficient doping concentration under the STI field oxide to prevent inversion. The fourth implant is the retrograde well implant providing the highest concentration at the greatest depth. The following table lists implant conditions for a core CMOS sub micron process:

|  | Dose (cm2) | Species | Energy (keV) |
|---|---|---|---|
| p-type threshold voltage adjust | $1 \times 10^{12} - 4 \times 10^{12}$ | B-11 | 5–25 |
| p-type punch through implant | $3 \times 10^{12} - 9 \times 10^{12}$ | B-11 | 50–80 |
| p-type channel stop | $2 \times 10^{12} - 5 \times 10^{12}$ | B-11 | 150–210 |
| p-well implant | $2 \times 10^{13} - 8 \times 10^{13}$ | B-11 | 400–650 |
| n-type threshold voltage adjust | $1 \times 10^{12} - 4 \times 10^{12}$ | Phosphorous | 30–60 |
| n-type punch through | $2 \times 10^{12} - 5 \times 10^{12}$ | Phosphorous | 140–170 |
| n-type channel stop | $1 \times 10^{12} - 4 \times 10^{12}$ | Phosphorous | 275–500 |
| n-well implant | $2 \times 10^{13} - 6 \times 10^{13}$ | Phosphorous | 750–900 |
| n-type LDD | $5 \times 10^{14} - 9 \times 10^{14}$ | Arsenic | 9–18 |
| p-type LDD | $2 \times 10^{14} - 5 \times 10^{14}$ | BF2 | 15–35 |
| n-type source-drain | $1 \times 10^{15} - 5 \times 10^{15}$ | Arsenic | 50–90 |
|  | $1 \times 10^{14} - 5 \times 10^{14}$ | phosphorous | 35–50 |
| p-type source-drain | $1 \times 10^{15} - 4 \times 10^{15}$ | Boron | 5–25 |

In CMOS processes, the n-well and the p-well will contain any combination of well, channel stop, threshold adjust, and punch through implants. In the following description of the various embodiments of the instant invention, the names given to the various regions of the DE transistors are function names that describe the function of the various implants in the core CMOS circuit. Unless otherwise stated, the above implant table represents implant conditions that can be used to form the various structures of the instant invention.

Figure 2A:
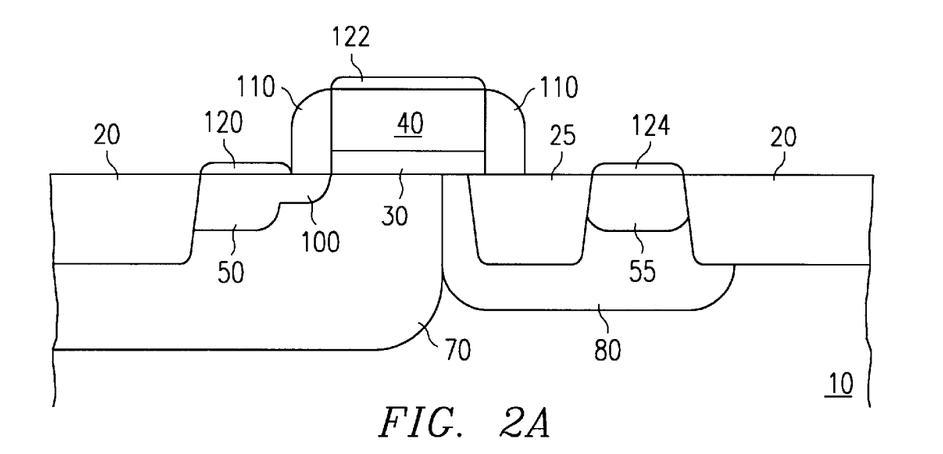

Shown in FIG. 2A is the cross-section of a DE-NMOS transistor according to an embodiment of the instant invention. Here the p-type silicon substrate will contain other CMOS transistors (not shown) fabricated in other region of the substrate. These CMOS transistors represent the core transistors and can have operating voltages of less than 3.5 volts. The DE transistor represented in FIG. 2A will have an operating voltage greater than that of the core transistors. The DE transistor will be simultaneously fabricated with the core transistors using many of the same processes. The fabrication process of the DE transistor will be described with respect to the function of the particular process in the core transistor fabrication sequence. For the structure shown in FIG. 2A, the isolation structures 20 and 25 are formed using STI processing technology and comprise silicon oxide. The trench depth is about 5000 A and the layout of the STI structures 20, 25 shown in FIG. 2A is defined by the photolithographic process used during trench formation. The core transistor fabrication process used here is a twin well process. This requires that an n-type region and a p-type region be formed in the substrate 10 for fabrication of the core PMOS and NMOS transistors respectively. During the n-well formation for the core transistors, region 80 is formed. For sub micron CMOS processes the n-well is formed by the implantation of any number of n-type dopant species into the substrate 10. In an embodiment of the n-well process, phosphorous ions are implanted at doses of $2 \times 10^{13}$ cm$^2$ to $7 \times 10^{13}$ cm$^2$ at energies of about 800 keV. Standard phototlithographic processes can be used to define region 80. During the p-well formation for the core CMOS transistors, region 70 is formed. For sub micron CMOS processes, the p-well can be formed by implanting any number of p-type dopant species into the substrate 10. In one embodiment, this could comprise implantation of a boron species at about $3 \times 10^{13}$ cm$^2$ at an energy of about 500keV. A gate dielectric 30 is formed on the substrate 10. The gate dielectric 20 may be comprised of an oxide, thermally grown SiO2, a nitride, an oxynitride, or any combination thereof, and is preferably on the order of 1 to 10 nm thick. The gate dielectric will be formed simultaneously for the core CMOS transistors and the DE transistor. A layer of silicon containing material (which will be patterned and etched to form transistor gate 40) is formed on gate dielectric 30. Preferably, this silicon-containing material is comprised of polycrystalline silicon("poly" or "polysilicon"), but it may be comprised of epitaxial silicon or any other semiconducting material. The DE transistor gate 40 and the core transistor gate structures (not shown) will be between 1800 A and 3000 A thick and will be implanted with phosphorous at about $5 \times 10^{13}$ cm$^2$ at 40 keV. The gate of the DE transistor 40 is positioned such that it overlaps the n-well implanted region 80, the p-well implanted region 70, and a portion of a STI region 25. The n-type lightly doped region 100 next to the source is formed during the core CMOS n-type LDD implant. This is a blanket implant that is aligned by the gate 40 and the STI region 20 underlying the gate 40. A potential core CMOS n-type LDD implant process is a $6 \times 10^{14} - 9 \times 10^{14}$ cm$^2$ arsenic implant at an energy of about 13–18 keV. Sidewall spacer structures 110 are formed using silicon dioxide, silicon nitride or other similar materials. The spacers 110 are formed by first forming a blanket film on the surface of the substrate followed by an anisotropic etch. The source region 50 and the drain region 55 are formed using the n-type source-drain implant. The metal silicide regions 120, 122, and 124 are formed using a standard self aligned salicide process. This process is done simultaneously for both the core and DE transistors and titanium silicide, tungsten silicide, or cobalt silicide can be used. For the DE structure shown in FIG. 2A, the drain extension region is provided by the core CMOS transistor n-well region 80. The p-well to n-well spacing distances may have to be optimized separately for the DE transistor to control the drain to bulk breakdown voltage (a larger spacing will increase the voltage) and the transistor characteristics, where a larger spacing will change the channel doping profile, possibly improving the transistor characteristics.

Figure 2B:
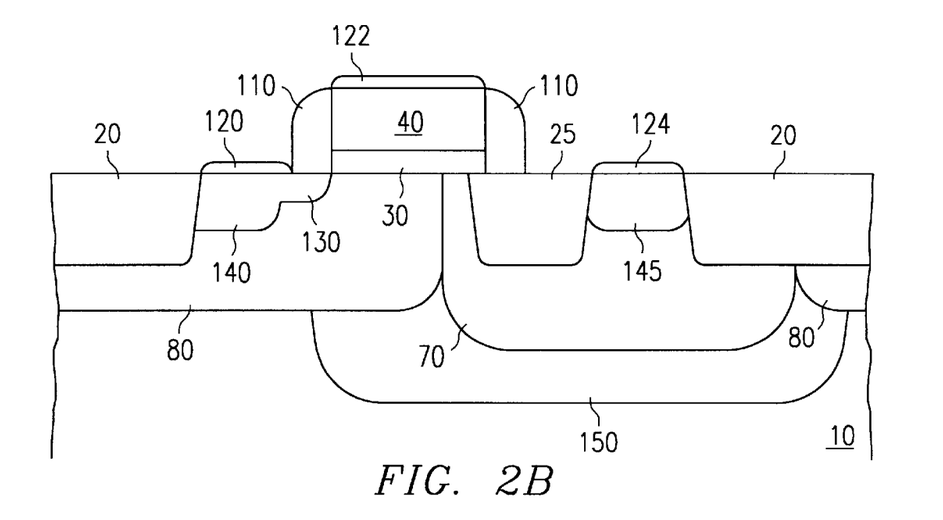

Illustrated in FIG. 2B is a DE-PMOS transistor according to an embodiment of the instant invention. In this structure, the gate 40 overlies the n-well region 80, the p-well region, and a portion of a STI structure 25 but here the p-well region 70 forms the drain extension region of the transistor. The lightly doped region 130 adjacent to the source 140 is formed using the p-type LDD implant. The source region 140 and the drain region 145 are formed using the core CMOS p-type source-drain implant. To provide isolation of the p-well drain extension region 70 from the p-type substrate 10, a deep n-well region 150 is formed by implanting phosphorous or arsenic into the substrate. This deep n-well region may require the use of an extra photolithographic masking step. The DE-PMOS device could also be fabricated without the deep n-well region 150. In this case the p-well drain extension region 70 would be electrically connected to the substrate.

Figure 3A:
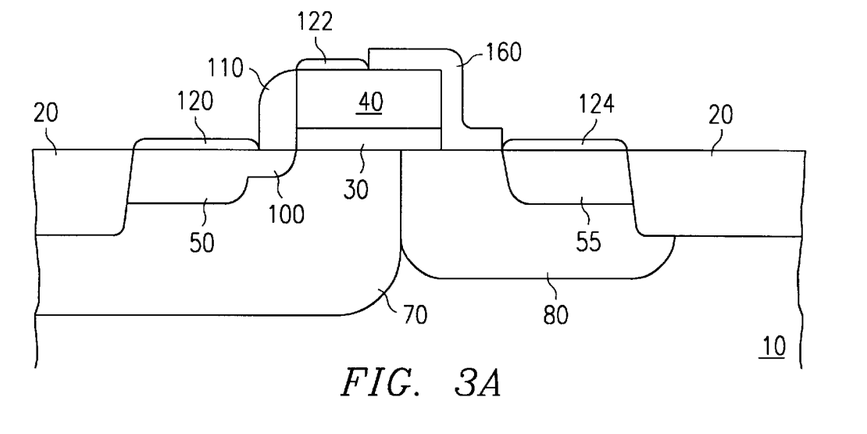

Illustrated in FIG. 3A is another embodiment of a DE-NMOS transistor according to the instant invention. In this structure the gate 40 overlies an n-well region 80 and a p-well region 70, but not a STI isolation region as in FIG. 2A. The silicide block structure 160 is formed using a photolithographic mask to block this region during the anisotrophic etch process used to form the sidewall structure 110. The drain and source regions will be self-aligned to the gate 40 and the silicide block structure during the CMOS n-type source-drain implant step. The metal silicide regions 120, 122, and 124 will form in regions of the substrate 10 not covered by nitride 110, 160 or containing a STI isolation structure 20. The mask required to form the silicide block structure is often present in sub micron CMOS processes and is used to form resistors and other integrated circuit components. If high voltage operation is required, the core CMOS LDD implants will have to be removed from regions under the silicide block structure using a photolithographic mask. The presence of the silicide block structure 160 will result in the metal silicide layer 122 forming on a portion of the gate 40. This will increase the total resistance associated with the gate structure 40.

Figure 3B:
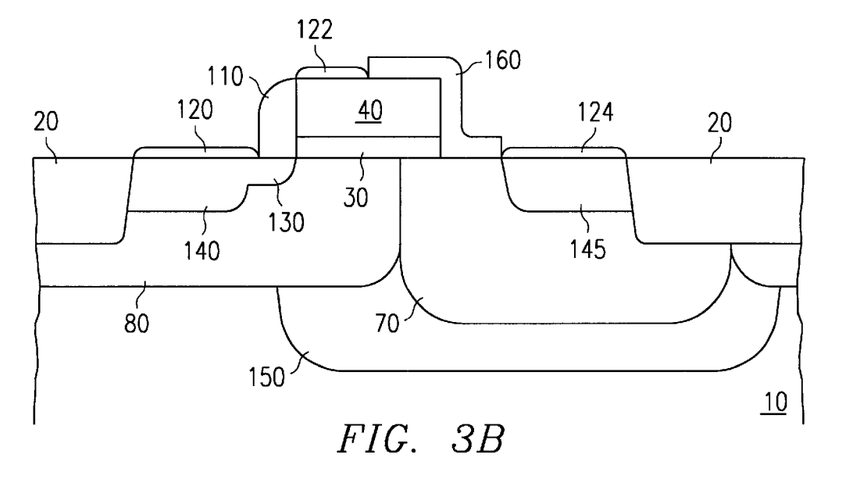

Illustrated in FIG. 3B is another embodiment of a DE-PMOS transistor according to the instant invention. In this embodiment the gate overlies the n-well region 80 and the p-well region 70. The p-well region 70 serves as the drain extension of the transistor. The silicide block region 160 is formed as described above. The deep n-well region 150 serves to isolate the p-well region 70 from the substrate 10.

Figure 4A:
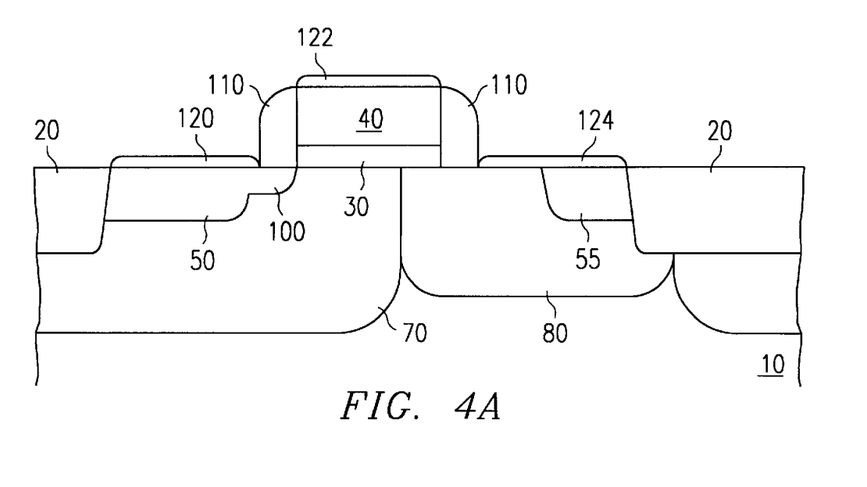

Illustrated in FIG. 4A is another embodiment of a DE-NMOS transistor. In this embodiment the gate 40 overlies the n-well region 80 and the p-well region 70. The n-well 80 region forms the drain extension region of the transistor. Region 100 adjacent to the source region 50 is formed using the core CMOS n-type. LDD implant which is blocked from regions adjacent to the drain region 55 by a photolithographic mask. This mask can be used to form the drain region 55 during the core CMOS n-type source-drain implant. In this embodiment, the metal silicide region overlying the drain region 124 extends to cover a portion of the n-well region 80.

Figure 4B:
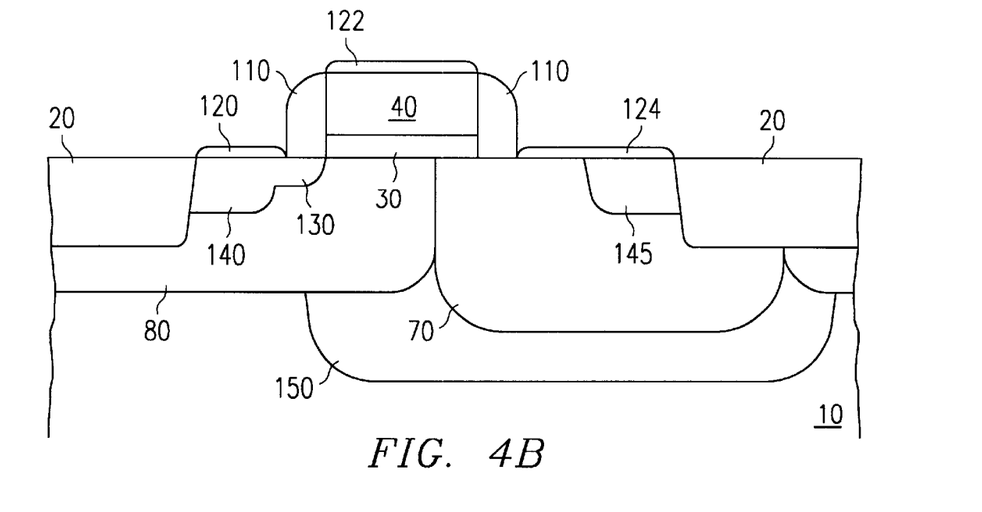

Illustrated in FIG. 4B is another embodiment of a DE-PMOS transistor. In this embodiment the gate 40 overlies the n-well region 80 and the p-well region 70. The p-well region 70 forms the drain extension region of the transistor. Region 130 adjacent to the source region 140 is formed using the core CMOS p-type LDD implant which is blocked from regions adjacent to the drain region 145 by a photolithographic mask. This mask can be used to form the drain region 145 during the core CMOS p-type source-drain implant. In this embodiment, the metal silicide region overlying the drain region 124 extends to cover a portion of the p-well region 70. A deep n-well region 150 is formed to isolate the p-well region 70 from the substrate 10.

Figure 5A:
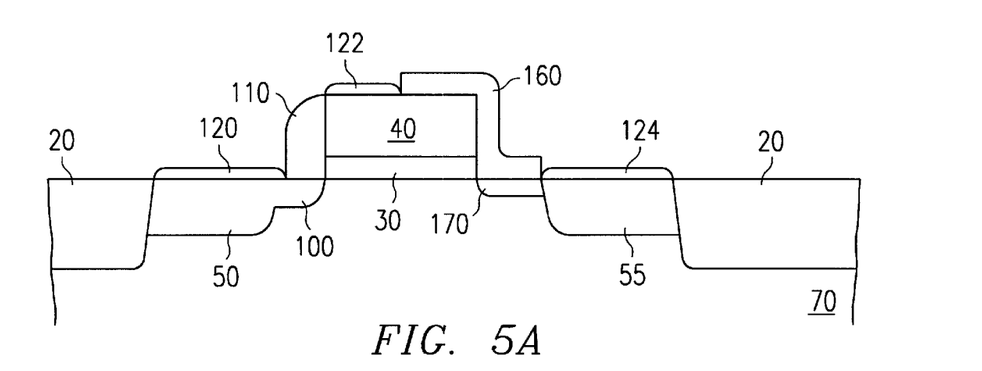

Shown in FIG. 5A is another embodiment of a DE-NMOS transistor. The transistor is formed entirely in a p-well region 70 in substrate 10. Region 100 adjacent to the source region 50 is formed using the core CMOS n-type LDD implant. Region 170 is a very lightly doped region with a n-type dopant concentration less than that of region 100. It is formed by first performing an implant to form region 170. A photolithographic mask is then used to mask region 170 during the core CMOS n-type LDD implant to form region 100. Regions 110 and 160 are formed as described above, and the source region 50 and the drain region 55 are formed using the core CMOS source drain implants. The metal silicide regions 120, 122, and 124 are formed as described above. The very lightly doped region 170 provides the drain extension region of the transistor.

Figure 5B:
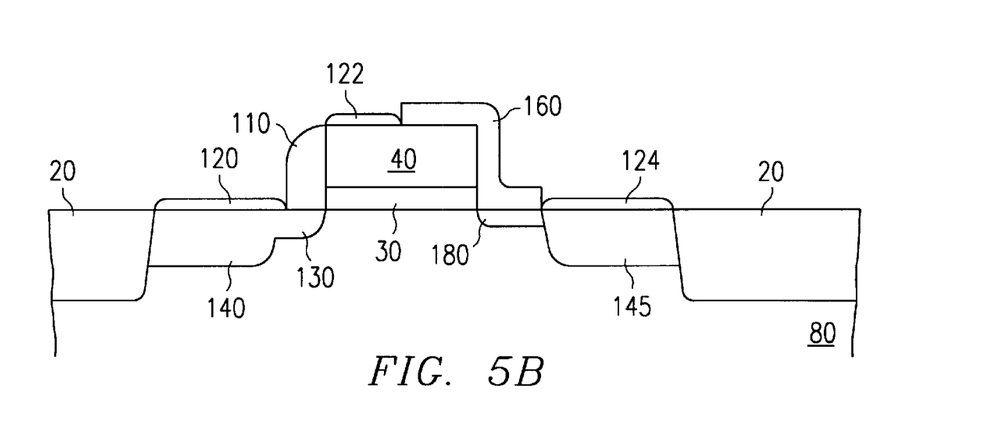

Shown in FIG. 52 is another embodiment of a DE-PMOS transistor. The transistor is formed entirely in an n-well region 80 in substrate 10. Region 130 adjacent to the source region 140 is formed using the core CMOS p-type LDD implant. Region 180 is a very lightly doped region with a p-type dopant concentration less than that of region 130.

It is formed by first performing an implant to form region 180. A photolithographic mask is then used to mask region 180 during the core CMOS p-type LDD implant to form region 130. Regions 110 and 160 are formed as described above, and the source region 140 and the drain region 145 are formed using the core CMOS p-type source-drain implants. The metal silicide regions 120, 122, and 124 are formed as described above. The very lightly doped region 180 provides the drain extension region of the transistor.

Figure 6A:
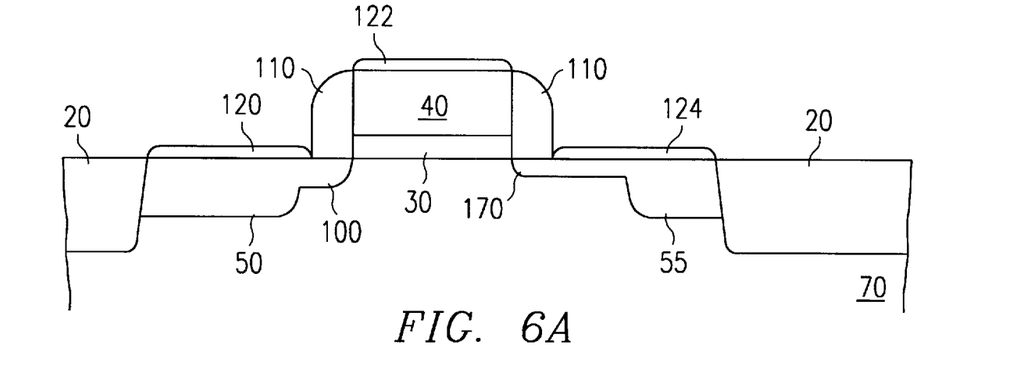

Illustrated in FIG. 6A is another embodiment of a DE-NMOS transistor according to an embodiment of the instant invention. The transistor is formed entirely in a p-well region 70 in substrate 10. Region 100 adjacent to the source region 50 is formed using the core CMOS n-type LDD implant. Region 170 is a very lightly doped region with a dopant concentration less than that of region 100. It is formed by first performing an implant to form region 170. A photolithographic mask is then used to mask region 170 during the core CMOS n-type LDD implant used to form region 100. The sidewall regions 110 are formed as described above, and a photolithographic mask is used to align the drain region 55 during the core CMOS n-type source-drain implants. The core CMOS mask used during the n-type source drain implants can be used to perform this function without adding an additional masking step. The metal silicide regions 120, 122, and 124 are formed as described above. The very lightly doped region 170 provides the drain extension region of the transistor.

Figure 6B:
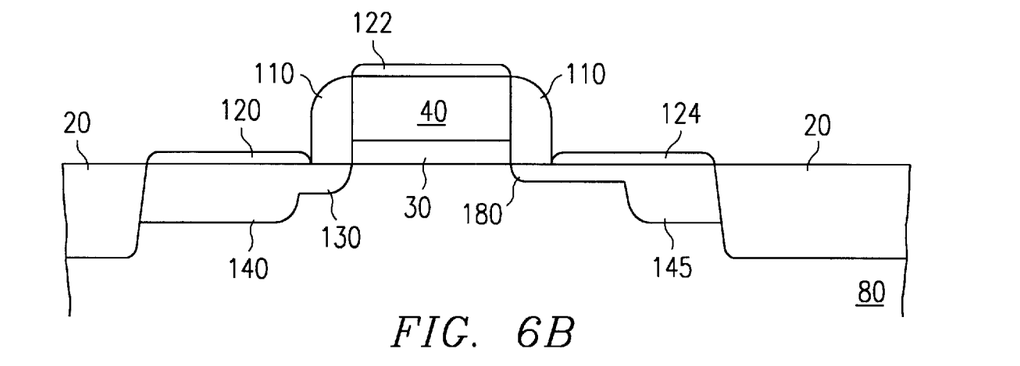

Illustrated in FIG. 6B is another embodiment of a DE-PMOS transistor according to an embodiment of the instant invention. The transistor is formed entirely in an n-well region 80 in substrate 10. Region 130 adjacent to the source region 140 is formed using the core CMOS p-type LDD implant. Region 180 is a very lightly doped region with a p-type dopant concentration less than that of region 130. It is formed by first performing an p-type implant to form region 180. A photolithographic mask is then used to mask region 180 during the core CMOS p-type LDD implant used to form region 130. The sidewall regions 110 are formed as described above, and a photolithographic mask is used to align the drain region 145 during the core CMOS p-type source-drain implants. The core CMOS mask used during the p-type source-drain implants can be used to perform this function without adding an additional masking step. The metal silicide regions 120, 122, and 124 are formed as described above. The very lightly doped region 180 provides the drain extension region of the transistor.

Figure 7A:
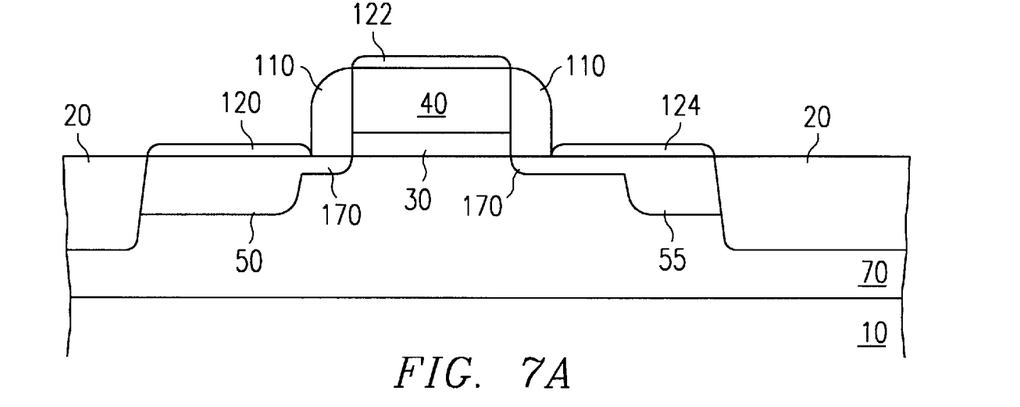

Illustrated in FIG. 7A is another embodiment of a DE-NMOS transistor according to an embodiment of the instant invention. The transistor is formed entirely in a p-well region 70 in substrate 10. In this embodiment a very lightly doped region 170 is formed adjacent to both the source region 50 and the drain region 55. By forming the core CMOS LDD regions using a two step implant process, the formation of regions 170 can easily be integrated, into a sub micron CMOS process flow. During the first core CMOS LDD implant step a blanket implant is performed that forms regions 170 aligned to the edge of the gate 40. During the second implant process step, a photolithographic mask is used to block this implant from entering the DE-NMOS structure. The sidewall regions 110 are formed as described above, and a photolithographic mask is used to align the drain region 55 during the core CMOS n-type source-drain implants. The core CMOS mask used during the n-type source drain implants can be used to perform this function without adding an additional masking step. The metal silicide regions 120, 122, and 124 are formed as described above. The very lightly doped region 170 provides the drain extension region of the transistor.

Figure 7B:
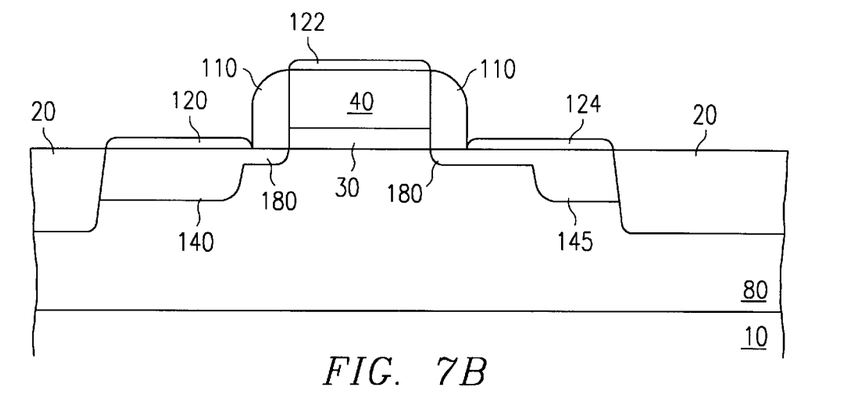

Illustrated in FIG. 7B is another embodiment of a DE-PMOS transistor according to an embodiment of the instant invention. The transistor is formed entirely in an n-well region 80 in substrate 10. In this embodiment a very lightly doped region 180 is formed adjacent to both the source region 140 and the drain region 145. By forming the core CMOS LDD regions using a two step implant process, the formation of regions 180 can easily be integrated into a sub micron CMOS process flow. During the first core CMOS LDD implant step a blanket implant is performed that forms regions 180 aligned to the edge of the gate 40. During the second implant process step, a photolithographic mask is used to block this implant from entering the DE-PMOS structure. The sidewall regions 110 are formed as described above, and a photolithographic mask is used to align the drain region 145 during the core CMOS p-type source-drain implants. The core CMOS mask used during the p-type source drain implants can be used to perform this function without adding an additional masking step. The metal silicide regions 120, 122, and 124 are formed as described above. The very lightly doped region 180 adjacent to the drain region 145 provides the drain extension region of the transistor.

Figure 8A:
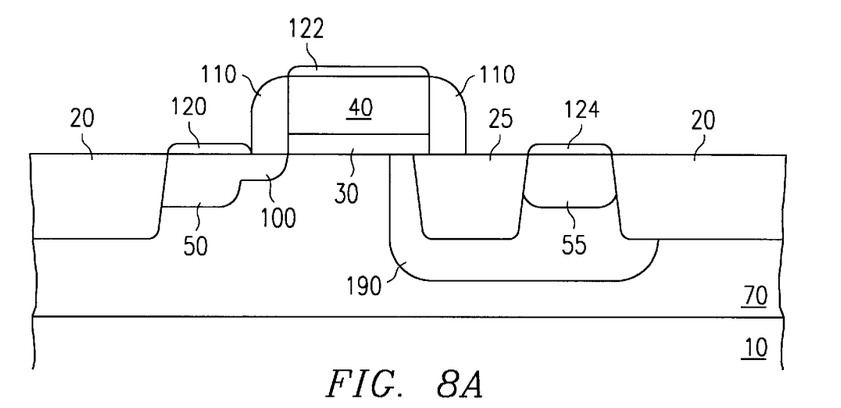

As described above, in sub micron CMOS processes, a number of implants can be performed in sequence. These include the well implants, channel stop implants, punch through implants, and transistor threshold voltage adjust implants. It is possible to mask the channel stop implant, the punch through implant, and the transistor threshold voltage-adjust implant separately. This allows the CMOS channel stop implant to be used to fabricate the drain extension regions of integrated DE transistors. Illustrated in FIG. 8A is an embodiment of a DE-NMOS transistor fabricated using the core CMOS n-type channel stop implants to form the drain extension region. The transistor is fabricated in a p-well region 70 in substrate 10. The gate of the transistor 40 overlies a portion of an STI isolation structure 25. Region 100 adjacent to the source region 50 is formed using the core CMOS n-type LDD implant. Region 190 is formed using the core CMOS n-type channel stop implant. For the structure shown in FIG. 8A, this implant could be a $2\times10^{12}$–$6\times10^{12}$ cm$^2$ boron (B-11) implant at an energy of about 190 keV. This channel stop implant region 190 will function as the drain extension region of the transistor.

Figure 8B:
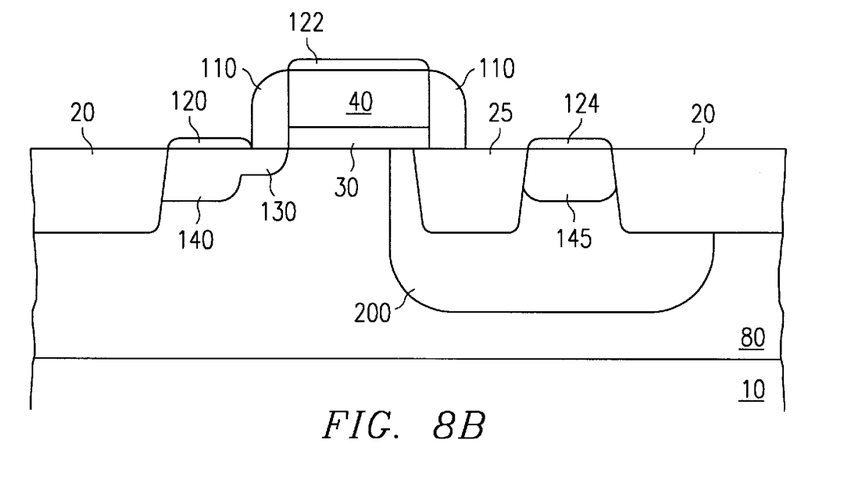

Illustrated in FIG. 8B is an embodiment of a DE-PMOS transistor fabricated using the core CMOS p-type channel stop implants to form the drain extension region. The transistor is fabricated in an n-well region 80 in substrate 10. The gate of the transistor 40 overlies a portion of an STI isolation structure 25. Region 130 adjacent to the source region 140 is formed using the core CMOS p-type LDD implant. Region 200 is formed using the core CMOS p-type channel stop implant. For the structure shown in FIG. 8B, this implant could be a $1\times10^{12}$–$5\times10^{12}$ cm$^2$ phosphorous implant at an energy of about 900 keV. This channel stop implant region 200 will function as the drain extension region of the transistor.

Figure 9A:
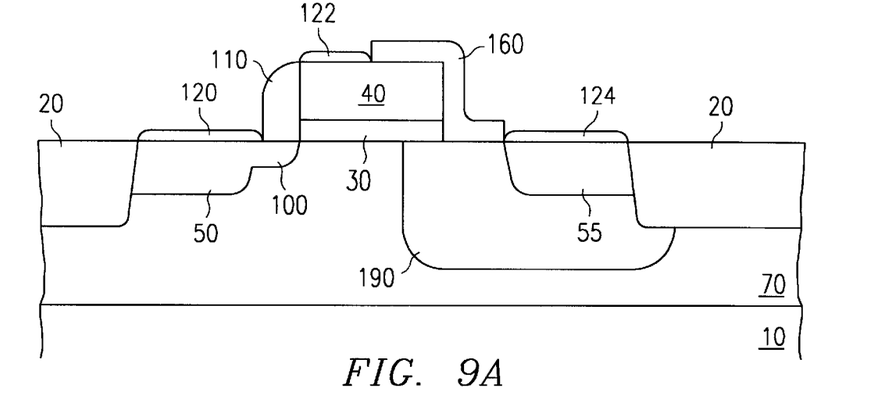

Illustrated in FIG. 9A is another embodiment of a DE-NMOS transistor fabricated using the core CMOS n-type channel stop implant according to the instant invention. In this structure the gate 40 overlies a p-well region 70 but not a STI isolation region as in FIG. 8A. The silicide block structure 160 is formed using a photolithographic mask to block this region during the anisotrophic etch process used to form the sidewall structure 110. The drain and source regions will be self-aligned to the gate 40 and the silicide block structure 160 during the CMOS n-type source-drain implant step. The channel stop implanted region 190 will function as the drain extension region of the transistor. The core CMOS n-type LDD implants used to form region 100 will have to be removed from regions under the silicide block structure using a photolithographic mask. The presence of the silicide block structure 160 will result in the metal silicide layer 122 forming on a portion of the gate 40. This will increase the total resistance associated with the gate structure 40.

Figure 9B:
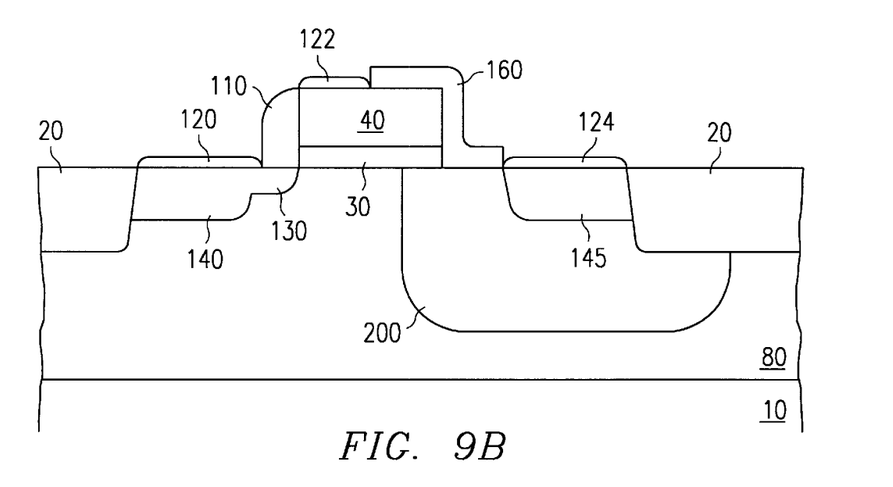

Illustrated in FIG. 9B is another embodiment of a DE-PMOS transistor fabricated using the core CMOS p-type channel stop implant according to the instant invention. In this structure the gate 40 overlies an n-well region 80 but not a STI isolation region as in FIG. 8B. The silicide block structure 160 is formed using a photolithographic mask to block this region during the anisotrophic etch process used to form the sidewall structure 110. The drain and source regions will be self-aligned to the gate 40 and the silicide block structure 160 during the CMOS p-type source-drain implant step. The channel stop implanted region 200 will function as the drain extension region of the transistor. The core CMOS p-type LDD implants used to form region 130 will have to be removed from regions under the silicide block structure using a photolithographic mask. The presence of the silicide block structure 160 will result in the metal silicide layer 122 forming on a portion of the gate 40. This will increase the total resistance associated with the gate structure 40.

Figure 10A:
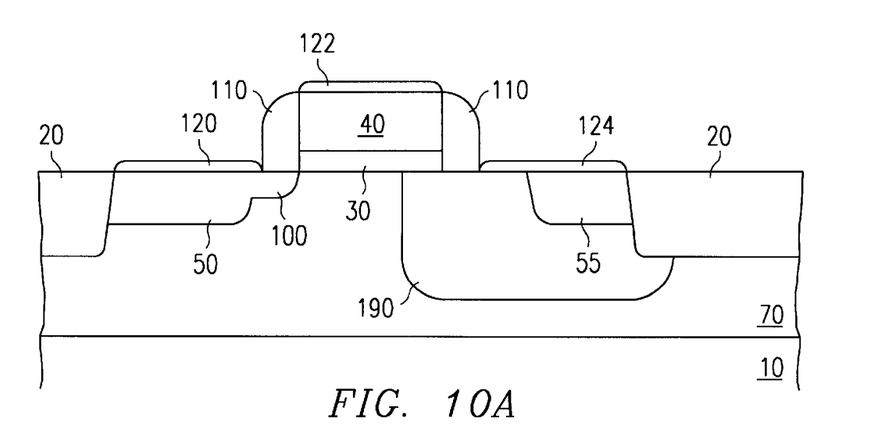

Illustrated in FIG. 10A is another embodiment of a DE-NMOS transistor fabricated using the core CMOS n-type channel stop implant according to an embodiment of the instant invention. The transistor is formed entirely in a p-well region 70 in substrate 10. Region 100 adjacent to the source region 50 is formed using the core CMOS n-type LDD implant. Region 190 is formed using the core CMOS n-type channel stop implant. A photolithographic mask is then used to mask region 190 during the core CMOS LDD implant to form region 100. The sidewall regions 110 are formed as described above, and a photolithographic mask is used to align the drain region 55 during the core CMOS n-type source-drain implants. The core CMOS mask used during the n-type source-drain implants can be used to perform this function without adding an, additional masking step. The metal silicide regions 120, 122, and 124 are formed as described above. Region 190 provides the drain extension region of the transistor.

Figure 10B:
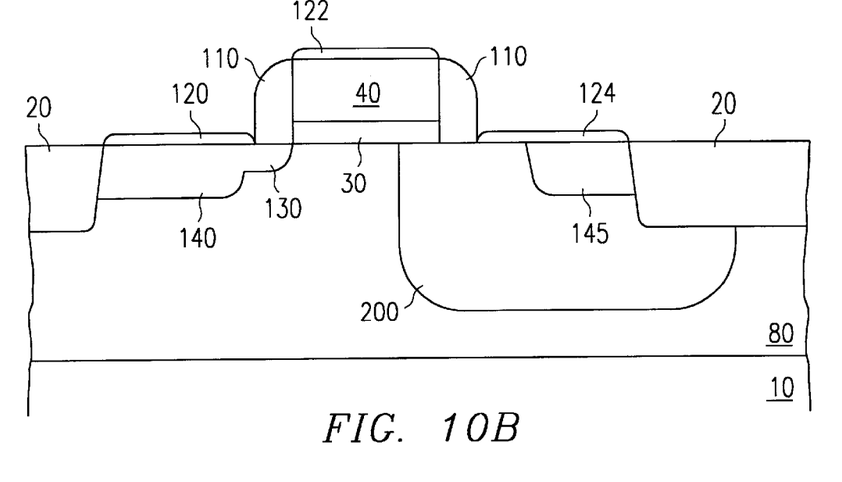

Illustrated in FIG. 10B is another embodiment of a DE-PMOS transistor fabricated using the core CMOS p-type channel stop implant according to an embodiment of the instant invention. The transistor is formed entirely in an n-well region 80 in substrate 10. Region 130 adjacent to the source region 140 is formed using the core CMOS p-type LDD implant. Region 200 is formed using the core CMOS p-type channel stop implant. A photolithographic mask is then used to mask region 200 during the core CMOS p-type LDD implant used to form region 130. The sidewall regions 110 are formed as described above, and a photolithographic mask is used to align the drain region 145 during the core CMOS p-type source-drain implants. The core CMOS mask used during the p-type source-drain implants can be used to perform this function without adding an additional masking step. The metal silicide regions 120, 122, and 124 are formed as described above. Region 200 provides the drain extension region of the transistor.

Figure 11:
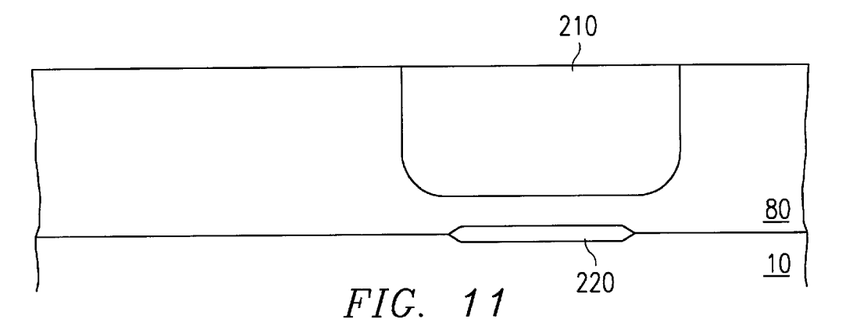
Figure 12A:
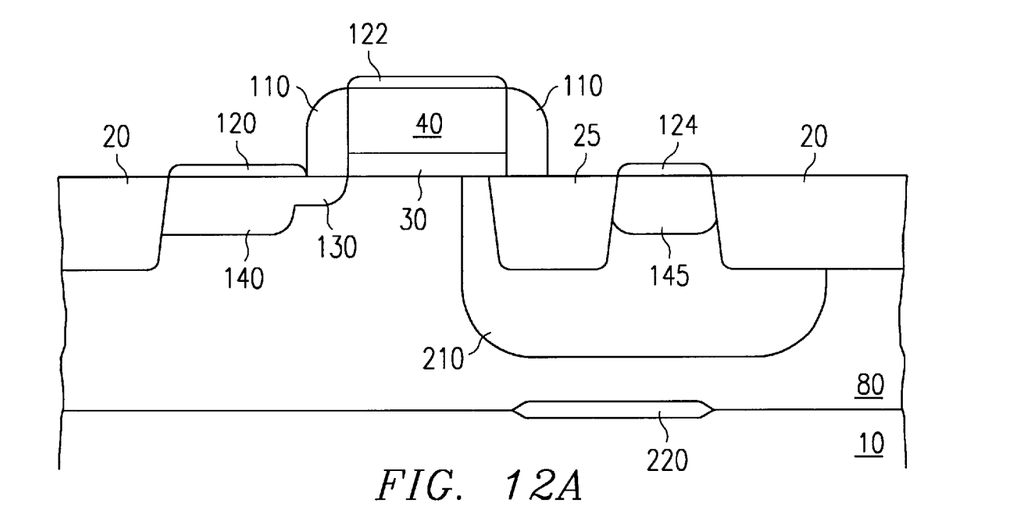

In cases where the core CMOS p-well concentration is higher than the n-well concentration near the silicon surface and the n-well concentration is higher than the p-well concentration deeper below the silicon surface a compensated well DE PMOS transistor can be fabricated. A DE NMOS transistor with a compensated well could be built if a n-substrate is used. The requirements for well concentrations will be opposite to that given above. A compensated well structure is shown in FIG. 11. The n-well region 80 is formed in the substrate as described above. During the formation of the p-well region for the core CMOS circuit, an opening is made in the p-well mask and a portion of the n-well region receives any number of p-type implants resulting in compensated p-region 210 and the buried p-well region 220 both being formed in the n-well region 80. It should be noted that the above process is not limited to the well implants, but can include all the implants made with the core CMOS well masks. Some of the additional implants that might be used in forming the compensated wells are the channel stop implants, the punch through implants, and the threshold voltage-adjust implants. Illustrated in FIG. 12A is a compensated well DE-PMOS transistor according to the instant invention. The gate structure 40 overlies a portion of an STI isolation structure 25. The compensated well region 210 provides the drain extension region of the transistor and should cover the drain region 145 and extender under the gate structure 40.

Figure 12B:
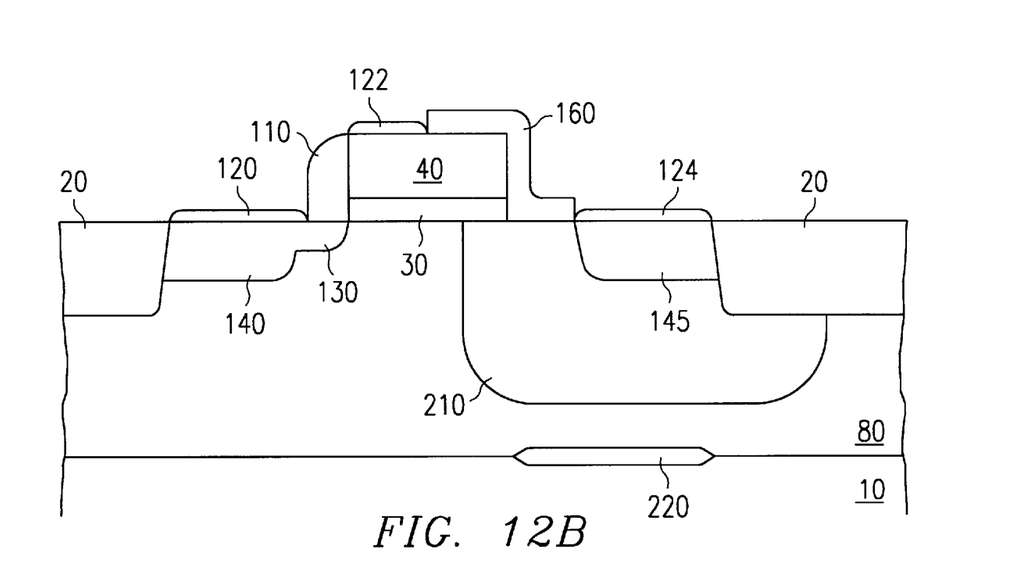

Shown in FIG. 12B is another compensated well DE-PMOS transistor according to the instant invention. In this structure the gate 40 overlies an n-well region 80 and a compensated p-well region 210 but not an STI isolation region as in FIG. 12A. The silicide block structure 160 is formed using a photolithographic mask to block this region during the anisotrophic etch process used to form the sidewall structure 110. The drain and source regions will be self-aligned to the gate 40 and the silicide block structure during the CMOS p-type source-drain implant step. The core CMOS p-type LDD implants will have to be removed from regions under the silicide block structure using a photolithographic mask. The presence of the silicide block structure 160 will result in the metal silicide layer 122 forming on a portion of the gate 40. This will increase the total resistance associated with the gate structure 40.

Figure 13:
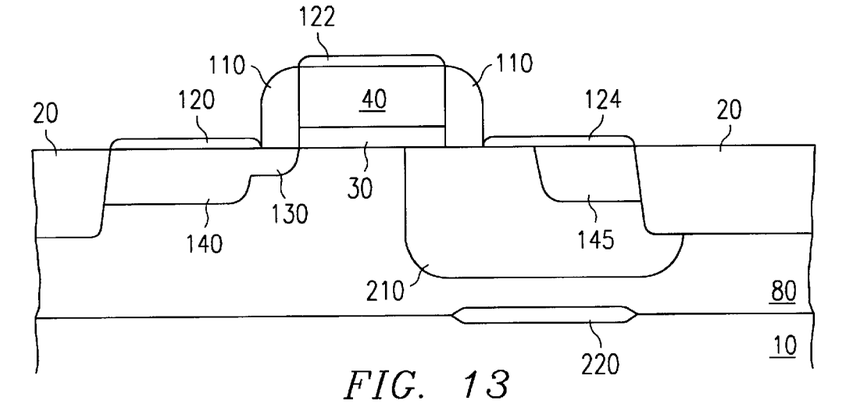

Illustrated in FIG. 13 is another embodiment of a compensated well DE-PMOS transistor according to an embodiment of the instant invention. The transistor gate 40 overlies an n-well region 80 and a compensated p-well region 210. Region 130 adjacent to the source region 140 is formed using the core CMOS p-type LDD implant. The compensated p-well region 210 provides the drain extension region of the transistor. A photolithographic mask is used to mask region 210 during the core CMOS p-type LDD implant used to form region 130. The sidewall regions 110 are formed as described above, and a photolithographic mask is used to align the drain region 145 during the core CMOS p-type source-drain implants. The core CMOS mask used during the p-type source-drain implants can be used to perform this function without adding an additional masking- step. The metal silicide regions 120, 122, and 124 are formed as described above.

Symmetric versions of all the DE-CMOS structures described above are possible, simply by repeating the drain structure for the source. The will result in a structure where source and drain are interchangeable, and where drain and source breakdown voltages are identical. Note that the gate to source rating is no longer set by the gate oxide strength, although gate oxide does limit the reverse bias permitted from gate to bulk. Symmetric transistors are useful for analog switch or multiplexed applications. If any transistor is built drain centered (that is the drain is surrounded by a ring of polysilicon gate), the breakdown voltage from drain to bulk may be increased as the drain implant does not run into the channel stop implant under the field oxide. The benefits of drain centered layout and of rounded corners may be less than the advantages obtained previously with older processes. The voltage rating from gate to bulk is still limited by the gate oxide thickness under reverse bias conditions because when the transistor is biased off, there will be accumulation in the channel region, and most of the applied gate to bulk voltage will appear across the gate oxide.

Each of these transistors described above will get adequate gate 40 doping of the correct polarity (n-type for NMOS and p-type for PMOS). In most cases, the polysilicon gate 40 receives the same implants as the core CMOS transistors. Where the silicide block region 160 extends over one edge of the gate polysilicon 40, that part of the polysilicon will be masked from the CMOS source-drain implants. However, lateral diffusion should be adequate to dope the polysilicon, and in the case of the NMOS transistors, a gate implant is unaffected by the silicide block region 160. The threshold voltages will be similar to core CMOS transistors with the same gate oxide thickness and threshold adjust doses. There will be second order effects, depending on which LDD implants are used and if a pocket implant gets into the structure. Since DE-CMOS operate at higher voltages, longer channels are likely to be required, and short channel effects are less important. It is always possible to add masking steps and withhold the threshold adjust implants, resulting in transistors with much smaller values for the threshold voltage.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. An integrated circuit drain extended transistor comprising:
    a semiconductor substrate comprising a first well region of a first conductivity type adjacent to a second well region of a second conductivity type;
    a transistor gate partially overlapping said first well region and said second well region;
    a transistor source region of a second conductivity type adjacent to said transistor gate and contained in said first well region; and a transistor drain region of a second conductivity type contained in said second well region.

2. The integrated circuit drain extended transistor of claim 1 wherein a shallow trench isolation region, contained in said second well region, is adjacent to said transistor drain region and is positioned between said transistor drain region of a second conductivity type and said transistor gate.

3. The integrated circuit drain extended transistor of claim 2 further comprising a third well region which contains said second well region.

4. The integrated circuit drain extended transistor of claim 1 wherein said transistor gate comprises:
   a dielectric layer; and
   a polysilicon layer overlying said dielectric layer.

5. The integrated circuit drain extended transistor of claim 1 wherein said first conductivity type is p-type and said second conductivity type is n-type.

6. The integrated circuit drain extended transistor of claim 1 wherein said first conductivity type is n-type and said second conductivity type is p-type.

7. The integrated circuit drain extended transistor of claim 1 further comprising a lightly doped region of a second conductivity type contained in said first well region, positioned adjacent to said transistor source region, and partially underlying said transistor gate.

8. An integrated circuit drain extended transistor comprising:
   a semiconductor substrate comprising a first p-type compensated well region contained in a core CMOS n-well region wherein said first p-type compensated well region comprises a core CMOS n-well implant and a core CMOS p-well implant;
   a transistor gate partially overlying said first p-type compensated well region and said core CMOS n-well region;
   a p-type transistor source region adjacent to said transistor gate and contained in said core CMOS n-well region; and
   a p-type transistor drain region contained in said p-type compensated well region.

9. The integrated circuit drain extended transistor of claim 8 further comprising a p-type transistor lightly doped region contained in said core CMOS n-well region, adjacent to said p-type transistor source region, and extending under a region of said transistor gate.

10. The integrated circuit drain extended transistor of claim 8 further comprising a shallow trench isolation region, contained in said p-type compensated well region, adjacent to said p-type transistor drain region and positioned between said p-type transistor drain region and said p-type transistor source region.

11. An integrated circuit drain extended transistor comprising:
    a semiconductor substrate comprising a first well region of a first conductivity type adjacent to a second well region of a second conductivity type wherein said first well region is separated from said second well region by a spacing distance;
    a transistor gate partially overlapping said first well region and said second well region;
    a transistor source region of a second conductivity type adjacent to said transistor gate and contained in said first well region; and
    a transistor drain region of a second conductivity type contained in said second well region.

12. The integrated circuit drain extended transistor of claim 11 wherein a shallow trench isolation region, contained in said second well region, is adjacent to said transistor drain region and is positioned between said transistor drain region of a second conductivity type and said transistor gate.

13. The integrated circuit drain extended transistor of claim 12 further comprising a third well region of a first conductivity type that contains said second well region.

14. The integrated circuit drain extended transistor of claim 11 wherein a silicide block structure partially overlies said transistor gate and said second well region and said transistor drain region is positioned adjacent to said silicide block structure.

15. The integrated circuit drain extended transistor of claim 11 wherein said transistor gate comprises:
    a dielectric layer; and
    a polysilicon layer overlying said dielectric layer.

16. The integrated circuit drain extended transistor of claim 11 wherein said first conductivity type is n-type and said second conductivity type is p-type.

17. The integrated circuit drain extended transistor of claim 11 wherein said first conductivity type is p-type and said second conductivity type is n-type.

18. The integrated circuit drain extended transistor of claim 11 further comprising a transistor lightly doped region of a second conductivity type contained in said first well region, positioned adjacent to said transistor source region, and partially underlying said transistor gate.

19. The integrated circuit drain extended transistor of claim 18 wherein said second conductivity type is p-type and said first conductivity type is n-type.

20. The integrated circuit drain extended transistor of claim 11 further comprising a third well region of a first conductivity type that contains said second well region.

21. An integrated circuit drain extended transistor comprising:
    a semiconductor substrate containing a first well region;
    a transistor gate partially overlapping said first well region;
    a silicide block structure partially overlapping said transistor gate and said first well region; and
    a transistor drain region contained in said first well region and positioned adjacent to said silicide block structure.

22. The integrated circuit drain extended transistor of claim 21 further comprising a second well region adjacent to said first well region wherein said transistor gate partially overlaps said second well region.

23. The integrated circuit drain extended transistor of claim 21 wherein said first well region is a CMOS n-well.

24. The integrated circuit drain extended transistor of claim 23 wherein said second well region is a CMOS p-well region.

25. The integrated circuit drain extended transistor of claim 21 wherein said first well region is a CMOS p-well.

26. The integrated circuit drain extended transistor of claim 25 wherein said second well region is a CMOS p-well region.

27. The integrated circuit drain extended transistor of claim 26 further comprising a deep p-well region which contains said first well, region.

28. A drain extended transistor comprising:
    a semiconductor substrate comprising a first well region of a first conductivity type adjacent to a second well region of a second conductivity type;
    a transistor gate partially overlapping said first well region and said second well region;

a transistor source region of a second conductivity type adjacent to said transistor gate and contained in said first well region;

a lightly doped region of a second conductivity type contained in said first well region, adjacent to said transistor source region, and underlying a portion of said transistor gate; and a transistor drain region of a second conductivity type contained in said second well region.

29. The drain extended transistor of claim 28 further comprising a shallow trench isolation region contained in said second well region and positioned between said transistor gate and said transistor drain region.

30. The drain extended transistor of claim 29 further comprising a third well region that contains said second well region.

31. An integrated circuit drain extended transistor comprising:

a semiconductor substrate comprising a first n-type compensated well region contained in a core CMOS p-well region wherein said first n-type compensated well region comprises a core CMOS p-well implant and a core CMOS n-well implant;

a transistor gate partially overlying said first n-type compensated well region and said core CMOS p-well region;

a p-type transistor source region adjacent to said transistor gate and contained in said core CMOS p-well region; and a n-type transistor drain region contained in said n-type compensated well region.

32. The integrated circuit drain extended transistor of claim 31 further comprising a n-type transistor lightly doped region contained in said core CMOS p-well region positioned adjacent to said n-type transistor source region, and extending under a region of said transistor gate.

* * * * *